United States Patent [19]
Kroeger et al.

[11] Patent Number: 5,395,821
[45] Date of Patent: Mar. 7, 1995

[54] METHOD OF PRODUCING PB-STABILIZED SUPERCONDUCTOR PRECURSORS AND METHOD OF PRODUCING SUPERCONDUCTOR ARTICLES THEREFROM

[75] Inventors: Donald M. Kroeger; Huey S. Hsu, both of Knoxville; Jorulf Brynestad, Oak Ridge, all of Tenn.

[73] Assignee: Martin Marietta Energy Systems, Inc., Oak Ridge, Tenn.

[21] Appl. No.: 969,070

[22] Filed: Oct. 30, 1992

[51] Int. Cl.$^6$ ...................... H01L 39/12; H01B 12/00
[52] U.S. Cl. ..................... 505/431; 505/738; 505/740; 505/433; 505/510; 252/518; 252/521
[58] Field of Search ............ 505/1, 738, 740; 252/518, 521

[56] References Cited

U.S. PATENT DOCUMENTS

| | | | |
|---|---|---|---|
| 3,496,622 | 2/1970 | Berghout et al. | 428/558 |
| 4,826,808 | 5/1989 | Yurek | 252/521 |
| 4,929,596 | 5/1990 | Meyer | 505/740 |
| 4,952,554 | 8/1990 | Jin | 505/740 |
| 4,983,576 | 1/1991 | Hagino | 505/740 |
| 5,002,928 | 3/1991 | Fukui et al. | 505/1 |
| 5,021,399 | 6/1991 | Hsu et al. | 505/1 |
| 5,032,568 | 7/1991 | Lau et al. | 505/1 |
| 5,032,571 | 7/1991 | Takemura | 505/1 |
| 5,034,372 | 7/1991 | Matsuno et al. | 505/1 |
| 5,081,102 | 1/1992 | Gay et al. | 505/1 |
| 5,108,983 | 4/1992 | Lackey, Jr. et al. | 505/1 |
| 5,118,659 | 6/1992 | Lafon | 505/1 |
| 5,120,703 | 6/1992 | Snyder et al. | 505/1 |
| 5,145,829 | 9/1992 | Asano | 505/740 |
| 5,208,215 | 5/1993 | Chen | 505/737 |

FOREIGN PATENT DOCUMENTS

| | | | |
|---|---|---|---|
| 0449161 | 2/1991 | European Pat. Off. | 505/1 |
| 0448463 | 9/1991 | European Pat. Off. | |
| 1179724 | 1/1988 | Japan | 505/1 |
| 2196022 | 1/1989 | Japan | 505/1 |
| 2196023 | 1/1989 | Japan | 505/1 |
| 2229722 | 3/1989 | Japan | 505/1 |

OTHER PUBLICATIONS

Liu "Stabilization of 110K Superconducting Phase . . ." *Physica C* v. *157* Mar. 1989 pp. 93–98.
Joo "Direct Preparation of Fine Bi–Pb–Sr–Ca–Cu–O Powder" *Yoop Hakhoechi* v. 28(5) 1991 (Abstract) pp. 353–358.
Endo et al, Preparation of the High–Tc . . . Superconductor, Japanese Journal of Applied Physics, vol. 27, No. 8, Aug. 1988.
Maeda et al, A New High–Tc . . . Element, Japanese Journal . . . Physic, vol. 27, No. 2, Feb. 1988.
Tohge et al, Direct Preparation . . . Pgrolysis, Japanese Journal . . . Physics, vol. 28, No. 7, Jul. 1989.
Endo et al, Composition Dependence . . . Properties, Japanese Journal . . . Physics, vol. 28, No. 2, Feb. 1989.
Sasakura et al, Single High–tc . . . System, Japanese Journal . . . Physics, vol. 28, No. 7, Jul. 1989.
Tripathi et al, Preparation of Single–Phase . . . Drying, vol. 10, No. 3, Material Letters, Oct. 1990.

*Primary Examiner*—Paul Lieberman
*Assistant Examiner*—M. Kopec
*Attorney, Agent, or Firm*—Edward A. Pennington; J. Donald Griffin; Harold W. Adams

[57] ABSTRACT

Metal oxide superconductor powder precursors are prepared in an aerosol pyrolysis process. A solution of the metal cations is introduced into a furnace at 600°–1000° C. for 0.1 to 60 seconds. The process produces micron to submicron size powders without the usual loss of the lead stabilizer. The resulting powders have a narrow particle size distribution, a small grain size, and are readily converted to a superconducting composition upon subsequent heat treatment. The precursors are placed in a metal body deformed to form a wire or tape and heated to form a superconducting article. The fine powders permit a substantial reduction in heat treatment time, thus enabling a continuous processing of the powders into superconducting wire, tape or multifilamentary articles by the powder-in-tube process.

26 Claims, 3 Drawing Sheets

METHOD OF PRODUCING PB-STABILIZED SUPERCONDUCTOR PRECURSORS AND METHOD OF PRODUCING SUPERCONDUCTOR ARTICLES THEREFROM

This invention was made with Government support under contract DE-AC05-840R21400 and PO 80X-SH104 awarded by the U.S. Department of Energy to Martin Marietta Energy Systems, Inc. and the Government has certain rights in this invention.

FIELD OF THE INVENTION

The present invention is directed to superconductor wires, tapes and multifilamentary conductors formed from aerosol superconductor powder precursors. The invention is further directed to a continuous me%hod of forming superconducting wires, tapes and multifilamentary conductors from the precursor and to a method of producing the powder precursor.

BACKGROUND OF THE INVENTION

Superconductivity is generally defined as the property of a material to have zero resistance to electric current. Until recently only a few materials were known to have superconducting properties at temperatures above about 23° K. These materials require the use of liquid helium to attain the critical temperature. Recently, higher temperature superconducting materials have been produced from ceramic materials. The ceramic materials may be fabricated in the form of a film by evaporation or by sputtering methods under vacuum. These high temperature superconducting materials have a superconductive transition temperature above 77° K. thereby allowing liquid nitrogen to be used as the cryogenic material.

The high temperature superconducting materials generally consist of metal oxides bonded together to form a ceramic-like structure. In one method of production, the metal oxides are mixed together as solids and heated at sintering temperatures of 700° C. to 1100° C. The sintered material is then reground and reheated. The material is pressed into pellets and sintered at high temperatures for several hours. The pellets may be annealed in an oxygen environment at a lower temperature between 400° C. and 800° C. These ceramics tend to be brittle and fragile and cannot be drawn out to form wires or tapes. Other methods of producing superconductors include the formation of various precursors in the form of powders. The powders may be formed by forming aerosol droplets of an aqueous solution of metal compounds. The droplets are heated in a carrier gas by passing the droplets through a reactor to remove the water vapor and to convert the metal compounds to metal oxides. The furnace temperatures are typically 600° C.–1000° C. The droplets have a residence time in the reactor of about 15 to 56 seconds. The resulting powders are then collected on high efficiency ceramic or glass fibers.

Superconductors from Bi-Sr-Ca-Cu-O have been produced which possess superconducting phases exhibiting a critical temperature of 110K. The nominal composition has been found to have a final ratio of 2:2:2:3 which has a transition temperature of about 110K. Lead (Pb) doping of the Bi-Sr-Ca-Cu-O composition has been shown to be beneficial in promoting the formation of the 110K phase. It has been observed that as much as 50% of the initial quantity of lead is vaporized during heat processing which produces the nominal 2223 composition. The volatile nature of PbO has made it difficult to control the quantity of lead in the final composition and thus difficult to produce the desired superconducting phase.

The superconductors have been prepared by a number of different methods including the powder-in-tube method. This method typically forms a superconducting material and pulverizes the superconducting material to a powder. The superconducting material is usually produced by a solid state method which forms a non-homogeneous material. The powder is then placed in a metal tube and drawn to form a wire. The wire typically requires heating at temperatures of 800° C. for 8–20 hours. This process requires long heating times which limits the production output.

These processes all have the disadvantage of producing superconducting materials either in small yields or of unpredictable composition. Furthermore, these processes use precursors that are not chemically homogeneous and thus require long heating times at high temperatures thereby inhibiting the development of a continuous process of forming superconductors. There is, therefore, a continuing need in the industry for a process of producing superconductor precursors with reduced Pb loss during synthesis and good chemical homogeneity for use in producing superconductor wires, tapes and multifilamentary articles.

SUMMARY OF THE INVENTION

The present invention is directed to a superconducting precursor and to an aerosol process of producing superconductor precursors in the form of metal oxide powders. More importantly, the invention is directed to a process of forming superconducting articles, and in particular, multifilamentary articles, using powder precursors formed by the aerosol process. One aspect of the invention is directed to an aerosol process of producing Pb doped powder precursors from a starting solution without measurable loss of lead. The resulting powders have a narrow particle size distribution of about 0.1 to 2.0 $\mu$m. The particles have a fine grain size of less than 1000 Å and generally on the order of 100 to 200 Å and good chemical homogeneity from grain to grain. The chemical homogeneity of the precursors enable the metal oxides to readily convert to a superconducting phase composition without the need for long heating times.

A further aspect of the invention is a process of producing superconducting wires, tapes and multifilamentary materials from the precursor powder without extensive heat treatment and without loss of lead. In one embodiment, superconducting wires and tapes are produced by the powder-in-tube method to form superconducting materials having good flexibility. The powder-in-tube process using the powder precursors requires comparatively shorter heat treatment times such that the wire-forming and some or all of the heat treatment steps can be carried out sequentially as a continuous process. The high rate of reactivity of these powders is also advantageous in hot fabrication processes in which superconducting compound formation occurs during fabrication. The superconducting cores have small secondary phase particles of less than 5 $\mu$m.

The advantages of the invention are basically attained by a method for preparing lead stabilized precursors by atomizing an aqueous solution comprising metal cations of Bi, Pb, Sr, Ca and Cu in a carrier gas to form droplets, the carrier gas being selected from $O_2$, $N_2$, Ar, He and mixtures thereof, wherein the metal cations can be pyrolyzed to metal oxides; feeding said atomized solution and carrier gas through a heated reaction zone to heat said atomized solution to a temperature and for a time sufficient to pyrolyze the metal cations to form a precursor superconducting oxide powder composition substantially without vaporization and loss of lead from the precursor superconducting oxide powder composition, the superconducting oxide powder comprising grains of crystalline or at least partially amorphous metal oxides having a size of less than about 1000 angstroms; and collecting the precursor superconducting oxide powder.

Other advantages of the invention are attained by a process for forming superconducting articles by forming a precursor superconducting oxide powder by atomizing a metal cation solution to form droplets in a carrier gas and pyrolyzing the metal cations at a temperature and for a time sufficient to convert said metal cations to oxides to form the precursor superconducting oxide powder having a particle size of about 0.1 $\mu$m to 2.0 $\mu$m and a grain size of less than 1000 angstroms, the metal cation solution containing metal cations in a ratio capable of forming superconducting metal oxides, introducing the precursor into a metal body and deforming the body to reduce the diameter and form a deformed body, and sintering the deformed body at an effective temperature and for a sufficient time to form a superconductor article having superconducting phases.

BRIEF DESCRIPTION OF THE DRAWINGS

The present specification is to be considered in conjunction with the drawings of which the following is a brief description.

DETAILED DESCRIPTION OF THE INVENTION

Figure 1:
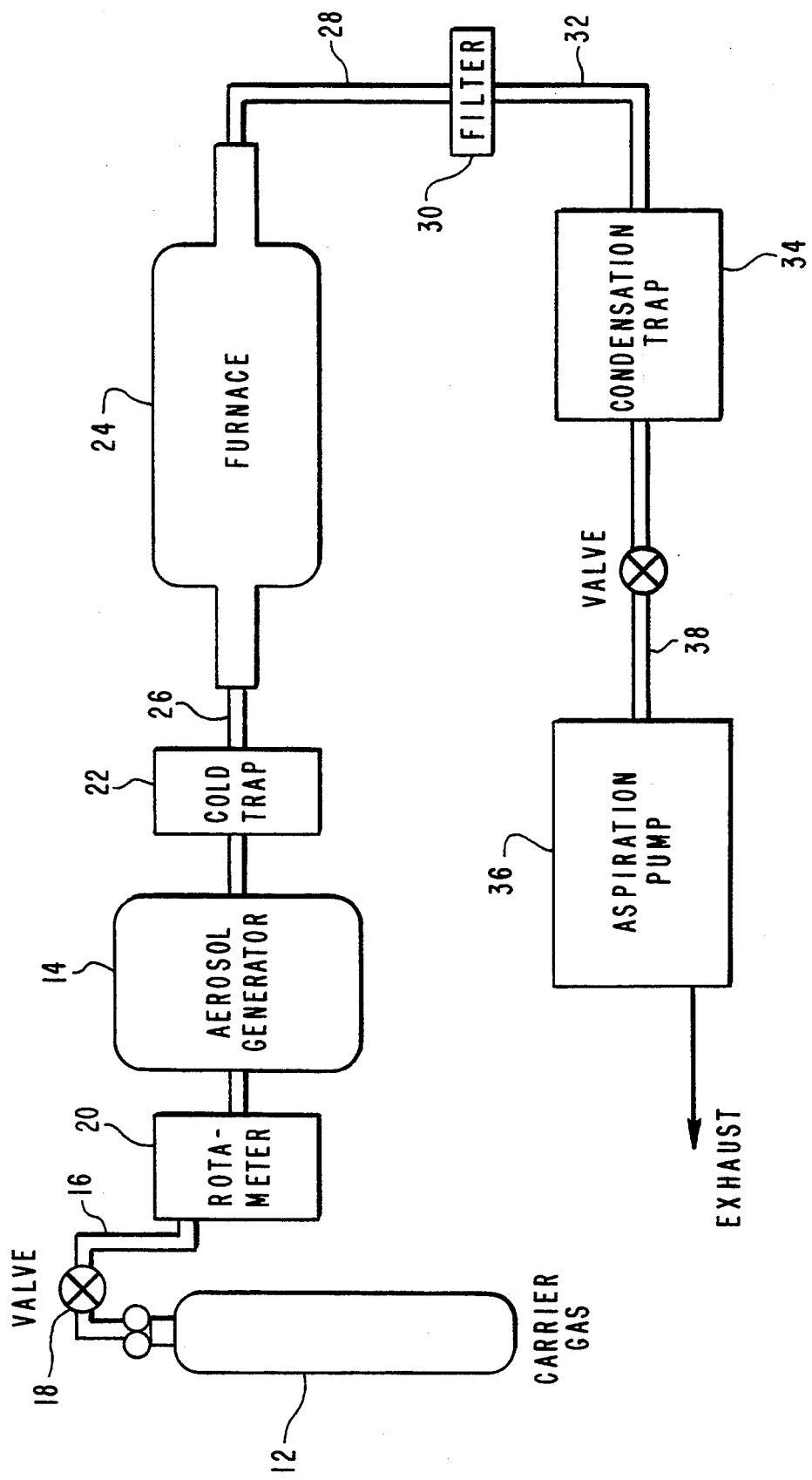
FIG. 1 is a schematic diagram of the apparatus in accordance with a preferred embodiment of the invention.

The present invention is directed to a continuous process of producing high Tc superconductor tapes, wires and multifilamentary articles from aerosol powder precursors. The invention is further directed to a process of forming the powder precursor by an aerosol process. One aspect of the invention relates to the production of a (Bi,Pb)-Sr-Ca-Cu-O superconductor powder precursor having a desired phase assemblage that is able to produce a superconductor having a substantial portion of the oxides in the desired superconducting phase.

The superconducting powder precursors produced by the aerosol process according to the invention have a small, narrow particle size range, a fine grain size within the particles, and excellent chemical homogeneity from grain to grain. These powder precursors are particularly suitable for producing superconducting articles by a powder-in-tube process. The small particle size and small grain size of the precursor allow the oxide phase assemblages to react quickly to form the desired superconducting phase during the heat treatment thereby making the continuous process possible. The particle size, grain size and chemical homogeneity are also suitable for producing multifilamentary superconducting cores where the filaments may have diameters of one to several microns, and the superconducting cores have small secondary phase particles.

The superconducting powder precursor may be any suitable mixture of cations capable of forming superconducting phases upon heat treatment. The concentration and proportions of the cations in the precursor will also vary with the desired superconducting phases in the finished article. In one embodiment of the invention, the precursor powder comprises metal oxides of Bi, Sr, Ca and Cu with the ratio of cations in the powder being determined by the desired superconducting phase in the superconducting article. In embodiments, the ratio of the cations in the superconducting phase may generally be represented by the nominal composition $Bi_2Sr_2Ca_{n-1}Cu_n$ where n is 1, 2 or 3. In further embodiments, the precursor includes Pb as a stabilizing component or doping agent.

The superconducting precursor powder in further embodiments may include one or more cations as dopants such as, for example, alkali metals such as K and Na, alkaline earth metals such as Ba, Mg, rare earth metals, and transition metals such as Sb, Tl, V, Mo, Y. For example, the precursor may have the composition Ba K Bi oxides or Tl Ba Ca Cu oxides.

The metal oxide powder precursors are produced by initially forming a metal ion solution. In a preferred form, an aqueous metal nitrate solution is prepared, for example, from $Bi_2O_3$, PbO, $SrCO_3$, $CaCO_3$, and CuO in concentrated nitric acid in proportions corresponding to the desired ratio of the metal oxides in the superconductor precursor powder. The solution is adjusted to about 0.01 to 0.5M total cation concentration. The solution is atomized and fed into a heated furnace as an aerosol. In preferred embodiments, an ultrasonic atomizer is used to atomize the solution. The atomized droplets are then carried by a carrier gas through an optional cold trap to remove excess moisture from the aerosol before being transferred through a reactor chamber operating at a temperature of about 600° C. to 1000° C. The residence time in the reactor chamber varies from 0.1 to 60 seconds and is preferably about 5 seconds or less depending on the temperature and concentration of the starting solution. The temperature of the reactor chamber and the residence time are selectively adjusted to pyrolyze and decompose the metal nitrates and produce a powder of the corresponding metal oxides without substantial loss of Pb. The resulting powder is then recovered as a superconductor precursor. The atomized nitrate solution forms droplets that are sufficiently small to rapidly decompose to the metal oxides without loss of lead. The short residence time of the compounds in the reactor produce the small particle size and fine grain size.

The starting solution is generally prepared by mixing stoichiometric amounts of the metal oxides, carbonates or nitrates in a nitric acid solution to form the respective nitrates in solution. The metal oxides, carbonates or nitrates are combined in concentrations and amounts corresponding to the desired ratio of cations in the superconductor precursor powder material. The ratio of cations in the precursor is selected by the desired superconducting phase after heat treatment. Although nitrate solutions are generally preferred for the solubility of the cations and rapid pyrolysis to the oxide, other metal cation solutions may be used which are able to solubilize a sufficient quantity of the cations in a form which can be readily pyrolyzed to the metal oxides. For example, the cation solution may be an aqueous metal nitrite solution in nitric acid or a cation solution in an organic solvent. Although any cation solution may be used, the solutions containing organic solvents or organic compounds are generally less preferred since the pyrolysis tends to produce carbon compounds which may interfere with the formation of some superconducting phases.

The solution of the metal ions preferably has a concentration of from about 0.01 to 0.5 M/l based on the concentration of cations in solution. The concentration of the solution will have an effect on the size and grain structure of the resulting powder as well as the phase assemblage of the material formed. The concentration is generally adjusted to produce small particles having a small grain size such as, for example a concentration of about 0.3 mole/l cations. Higher concentrations of the nitrate solution typically produce larger powder particles for a predetermined droplet size.

The carrier gas is selected from the group of oxygen, nitrogen, argon, helium and mixtures thereof. A frequently used carrier gas is argon containing about 5% by volume oxygen. The carrier gas is introduced to the system at a flow rate which depends on reaction chamber dimensions and the desired residence time. The flow rate is selectively adjusted to control the residence time of the atomized droplets in the reactor chamber to produce the powder by converting the nitrates to the respective oxides to produce the small particle and small grain size without loss of lead. The oxygen partial pressure may effect the phase content of the powder. Powders have been produced using carrier gas in the absence of oxygen.

The oxide powder precursors produced by the aerosol process have oxide phase assemblages which upon heat treatment produce superconducting materials containing predetermined superconducting phases. The powder precursors are subsequently formed into superconducting materials by heat treatments as discussed hereinafter in greater detail. In one preferred embodiment, the precursor powder comprises bismuth, strontium, calcium and copper oxide. The resulting superconductor produced by heating the powder preferably has bismuth, strontium, calcium and copper oxides in the 2223 superconducting phase. This phase of superconducting material has a critical temperature of (Tc) 105°–110° K. and is referred to as high Tc phase or 2223 phase. Other phases which may be produced include the 2212 phase having a Tc of 65°–90° K. and a nominal composition of $Bi_2 Sr_2 Ca Cu_2$ oxide and the 2201 phase having a Tc of 10°–20° K. and a nominal composition of $Bi_2 Sr_2 Cu$ oxide. The superconducting phases are identified by their nominal composition and structures as determined by X-ray diffraction. Although the actual superconducting phases are not capable of being defined by precise formulas, the composition of the superconducting phases may be approximated. For example, the Bi(Pb) 2223 phase may be represented as $Bi_{1.3-2.4} Pb_{0-0.6} Sr_{1.7-2.4} Ca_{1.7-2.6} Cu_3$ oxide, the Bi 2212 phase as $Bi_{1.8-2.2} Sr_{1.8-2.2} Cu_1$ oxide, and the Bi 2201 phase as $Bi_{1.6-2.4} Sr_{1.8-2.2} Cu_1$ oxide. The superconducting phase of the final article after heat treatment of the powder may be of the Bi Sr Ca Cu superconductor system, the Yttrium and rare earth 123 superconductor system such as $YBa_2Cu_3O_7$ and the (Th,Pb) (Sr,Br) Ca Cu oxide superconductor system such as $Th_1 (Ba,Sr)_2 Ca_2 Cu_3$ (1223) or $Th_1 (Ba,Sr)_2 Ca_1 Cu_2$ (1212). Other thallium oxide superconductors include the 2223 and 2212 oxides.

The superconducting oxide precursors are produced by the apparatus schematically illustrated in FIG. 1. A source 12 of carrier gas is connected to an aerosol generator 14 by conduit 16. A valve 18 and metering device 20 are connected between the carrier gas source 12 and the aerosol generator 14. The aerosol generator atomizes the nitrate solution which is then transferred to an optional cold trap 22 to remove excess moisture. The atomized droplets are transferred to the reactor chamber or furnace 24 by line 26 where the atomized droplets are pyrolyzed to remove any remaining water vapor and decompose the nitrates to the respective oxides. The resulting powder exits the furnace 24 by line 28 to a filter 30 where the particles are collected. The carrier gas continues through line 32 to a condensation trap 34 to collect any remaining water vapor. In a preferred embodiment of the invention an aspiration pump 36 is connected to the apparatus by line 38 to operate the apparatus at below atmospheric pressure. The aerosol generator 14 in a preferred embodiment is an ultrasonic nebulizer. An exemplary ultrasonic nebulizer includes a conventional piezoelectric element 40 in contact with the solution 42. A glass tube 44 is disposed above a reservoir 48 containing the solution of cations. A tube 52 extends from the top of the glass dome 44 to a pressure transducer to maintain the pressure in the glass dome 44. The carrier gas enters the side of the glass dome 44 through conduit 56 and exits through the top by conduit 58. Conduit 58 leads to the optional cold trap 22 and furnace 24. During operation the solution is atomized by the ultrasonic energy to form a cloud of aerosol which is then suspended in the carrier gas and carried to the furnace.

The ultrasonic piezoelectric element is a conventional device as known in the art. The piezoelectric element is able to produce sound waves having frequencies above 20,000 Hz although effective atomization occurs at about 1.6 MHz. The ultrasonic nebulizer produces aerosol droplets in the range of about 0.1 to 50 $\mu m$, preferably less than 10 $\mu m$, and most preferably about 0.1 to 1.0 $\mu m$. It is generally preferred to form droplets less than about 5–10 $\mu m$ to promote formation of particles of less than about 1.0 $\mu m$–2 $\mu m$. The powder particle size distribution typically ranges from about 0.1–2.0 $\mu m$ depending on the aerosol droplet size. In one preferred form, the powder is produced having substantially all of the powder particles less than 1.0 $\mu m$ and a grain size less than 1000 angstroms.

The cold trap 22, which is optional, is a conventional trap, preferably connected to an ice bath. The cold trap is at a temperature to cause excess amounts of moisture in the carrier gas stream to condense and thus be removed from the system. The amount of moisture in the gas stream determines the temperature at which the particle collector must be maintained to prevent condensation of water. Lower moisture content permits a lower filter temperature, which is desired to minimize the rate at which the collected particles "back-react" with $NO_x$ in the gas stream. Typical filter temperatures range between 40°–60° C.

The reactor chamber/furnace 24 in preferred embodiments is a quartz, alumina, or mullite tube having a diameter of, for example, about 2 inches and a length of about 90 inches. The furnace includes external means to heat the reactor chamber to temperatures of about 600° C. to about 1000° C. In further embodiments, the furnace is heated to a temperature to heat the powder up to about 850° C. In an alternative embodiment, the powder is heated up to about 750° C.

The filter 30 is a conventional high efficiency filter as known in the art to collect the resulting powder precursor. In one embodiment the filter may be a ceramic filter. An electrostatic collector may replace the filter.

The process is preferably carried out continuously by introducing the atomized solution into the furnace operated at about 600° C. to 1000° C. and collecting the resulting powder on a filter. It has been discovered that for solutions containing lead, the vaporization of lead and thus the loss of lead can be minimized by selectively adjusting the residence time of the aerosol droplets and the powder in the reaction chamber in relation to the temperature. Atomizing the precursor solution using an ultrasonic atomizer produces sufficiently small droplets such that the metal nitrates are able to decompose to the respective oxides rapidly without loss of the lead. For example, furnace temperatures of 850° C. where the powder has residence time of 5 seconds or less produces an oxide precursor with no measurable lead loss. The cation composition of the powder is substantially the same as in the solution. The powder precursor produced by the process has a narrow particle size range such that substantially all of the particles range from about 0.1 to 2.0 $\mu$m. Residence times range from about 0.1 to 60 seconds and preferably up to about 5 seconds or less depending on the temperature of the reactor chamber and the desired phase assemblage in the powder. Starting solutions that do not contain lead produce powders having a narrow particle size distribution of about 0.1 to 2.0 $\mu$m and a small grain size when heated in the reaction zone at 850° C. for about 5 seconds or less.

The powder precursor particles are shown to consist of a large number of very small grains of crystalline oxides when examined under scanning electron microscope. The grains generally are made up of metal oxides which are crystallites or at least partially amorphous. The size of the grains which make up the powder particles is usually less than 1000 angstroms and generally between about 100 and 200 angstroms. In one preferred form, the particles have substantially all of the grains less than about 200 angstroms. The small grain size within a particle implies chemical homogeneity on a fine scale from one grain to another. The chemical homogeneity of the precursor is believed to promote the rapid formation of the superconducting phase during subsequent heat treatments. The powder precursor particles have a cation concentration ratio corresponding substantially to that of the initial precursor solution.

Although details of the pyrolysis process are not completely understood, it is believed that the small grain size results from the short residence time of the cations in the reaction zone. The short residence time permits the rapid and efficient formation of phase assemblages in the powder to produce the desired Tc superconducting phase upon subsequent heat treatment. The short residence time of the cations in the reaction zone also prevent loss of lead from solutions containing lead as a dopant. The powder and the grains typically have a ratio of cations corresponding to the initial solution. The phase assemblage in the grains produced by the process, although not completely understood, has a ratio of cations corresponding to the ratio of the cations in the original nitrate solution. The phase assemblages are believed to be mixtures of the metal oxides which result in the corresponding Tc superconductor phase when formed into superconducting articles by heating.

The resulting powders have a fine grain size within a particle. As a consequence, atomic diffusion distances required to form the high Tc phase are short. The small grain size and chemical homogeneity enable the superconducting phase to be formed by short heating times, generally in a few hours. The small grain size and chemical homogeneity are believed to promote the formation of the superconducting phase by a route different than the larger grain size precursors.

The precursor powders are then used to produce superconductor materials. The phase assemblage and characteristics of the precursor powder determine to a large degree the characteristics of the superconductor material. The precursor powders as produced by the process discussed above have an average particle size typically less than 1.0 $\mu$m. The powders are preferably heat treated before use to remove any residual nitrates, nitrites and water which may be present. The powders may be, for example, heat treated by heating to about 500° C. to 700° C. in a partial vacuum for 2 to 4 hours.

In a preferred embodiment, the powder precursor is formed into superconducting wires or tapes by the powder-in-tube process. The powders are inserted into metal tubes, and drawn into round wires. The metal tubes are generally formed from silver, silver alloys such as silver-palladium alloys, gold or gold alloys. The initial metal tube is generally about 0.25 to 0.50 inch outer diameter which is drawn to a wire having a diameter of about 0.05 inch to 0.75 inch. The round wires may then be rolled and pressed into tapes having a thickness of about 0.010 to 0.020 inch and a width of about 0.10 to 0.25 inch. The tapes are then heat treated by sintering for sufficient time to form the superconducting phase, generally about 3–10 hours at 800° C. to 840° C. The heat treated tapes are then further deformed and heated for a second time. The second heating step is generally at about 795°–840° C. The powder-in-tube superconductors are fabricated into a tape by drawing and rolling to a thickness of about 250 $\mu$m and a powder core thickness of about 30 to 60 $\mu$m.

The small grain size on the order of a few hundred angstroms promotes the rapid formation of the superconducting phase. The initial heating step at about 800°–840° C. converts the powder oxides into the superconducting material in as little as 3 hours.

The superconducting tapes have resistively measured critical temperatures of 106K when the precursor solution is prepared to form the 2223 phase. Critical current densities of up to 10,000 A/cm$^2$ at 77K are obtained in conductors fabricated by drawing and rolling and given first-stage heat treatments of only 3 to 6 hours duration. X-ray diffraction of the phase content of the core after the first heat treatment indicates that the amount of high Tc phase (2223) is dependent on the treating time and the phase assemblage of the powder. The fine grain size of the powder prepared by the aerosol process produces an oxide superconducting core having a high fraction of the desired superconducting phase. The core further exhibits a small fraction of non-superconducting secondary phase particles. The secondary phase particles have a particle size of less than about 5 $\mu$m, typically less than 1 $\mu$m.

The precursor powders prepared by the above process have a good chemical homogeneity and small grain size such that the initial sintering times during the formation of the superconductors can be performed in about 3 to 10 hours at 800° C. to 840° C., preferably about 3–5 hours. It is believed that the superconducting phase forms with minimal transient melting.

In a preferred embodiment of the oxide-powder-in-tube process the final stages of fabrication and heat treatments which form the desired high Tc phase with a highly textured microstructure are carried out sequentially in a continuous process in which a wire or ribbon is fed continuously from a fabrication device, e.g., a rolling mill, to a furnace, to a rolling mill, to a furnace, and so on, for as many steps as required to obtain the desired dimensions, microstructure and superconducting properties. The length of the furnace and/or the path through the furnace can be adjusted to obtain appropriate heat treatment times at each stage. The short heat treatment times needed for aerosol powders makes such a continuous process possible. It is believed the small particle size of the precursor and the short residence time promote the formation of small grains within a particle and thus rapid formation of the superconductor phase.

In a particularly preferred form of the invention, a multifilament superconductor is produced from the aerosol powders. The multifilamentary superconductor may be formed from a billet of silver or other suitable metal having holes formed therein. The superconductor powder is placed in the holes of the billet and the billet is deformed by drawing or swaging to form a wire. The wire is heat treated to form the superconducting phase and again deformed. The deformed billet is cut and bundled together. The deforming, heating, cutting and bundling steps may be repeated several times to form a multi-filament article having up to several thousand filaments. In a preferred embodiment, the multifilament article is made up of filaments having a superconducting core of about 1 to 5 microns.

The superconducting precursor powder produced by the aerosol pyrolysis is particularly suitable for multifilament superconductors due to the homogeneous composition of the powder particles. The small grain size and homogeneous composition enable the formation of the fine filaments without long heat treating times and without formation of large secondary non-superconducting phase particles. Multifilamentary superconductors are advantageous for many applications due to their improved mechanical properties, lower AC current losses and their thermal and electrical stability.

EXAMPLE 1

Figure 2:
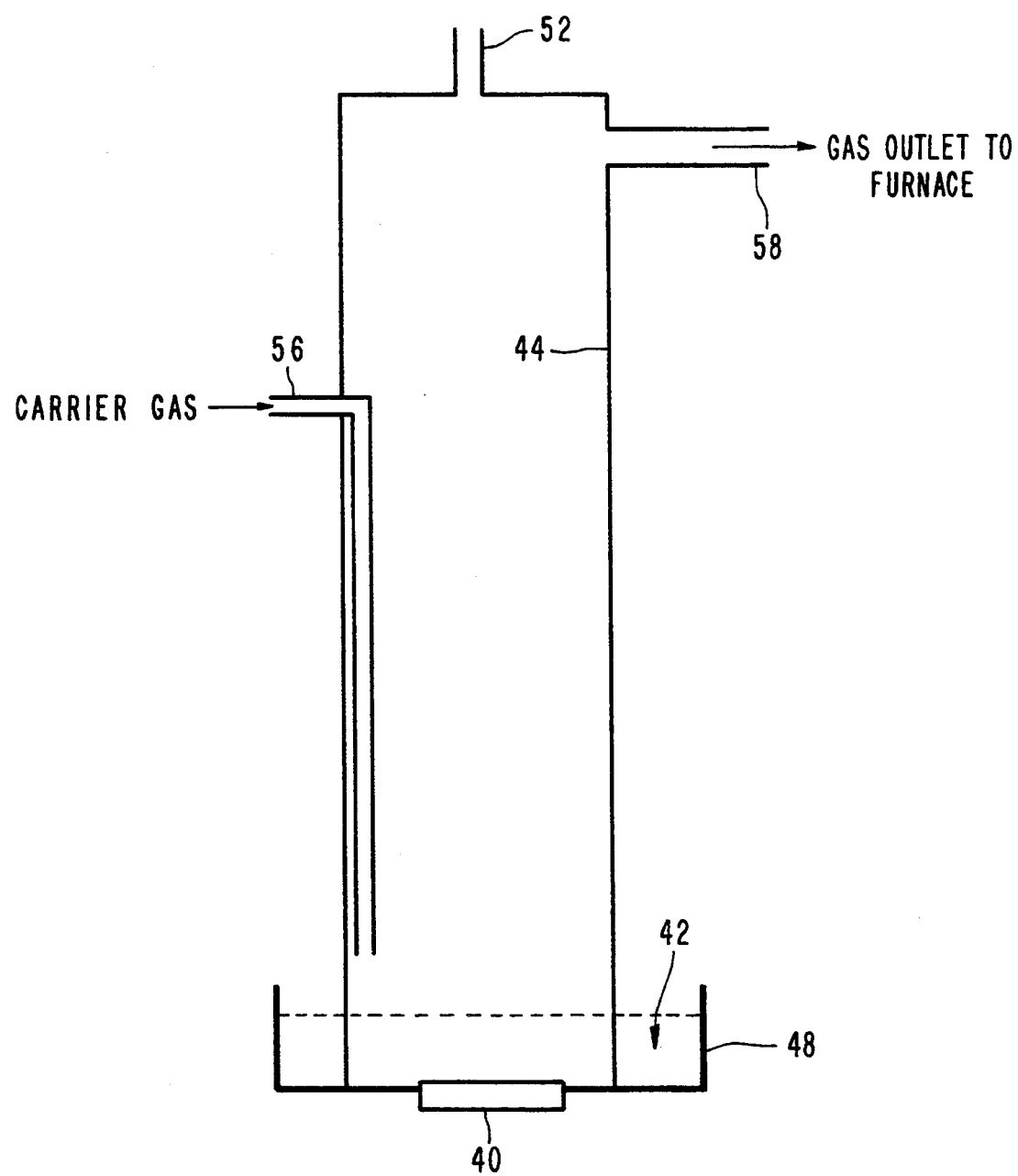
FIG. 2 is a schematic diagram of the ultrasonic atomizer in accordance with one embodiment of the invention.

A nitric acid solution containing Bi, Pb, Sr, Ca and Cu ions in the concentration ratio desired for the precursor powder is prepared. A pH of about 0.5 is generally necessary to keep the $Bi^{+3}$ in solution. The solution is introduced to an ultrasonic atomizer substantially as shown in FIG. 2. The solution is passed through an externally heated reactor chamber at a temperature of 840° C. The flow rate of the atomized particles is controlled by a carrier gas of argon and 5% oxygen to attain a residence time of about 2 seconds. The powder is collected on a high efficiency filter.

Figure 3:
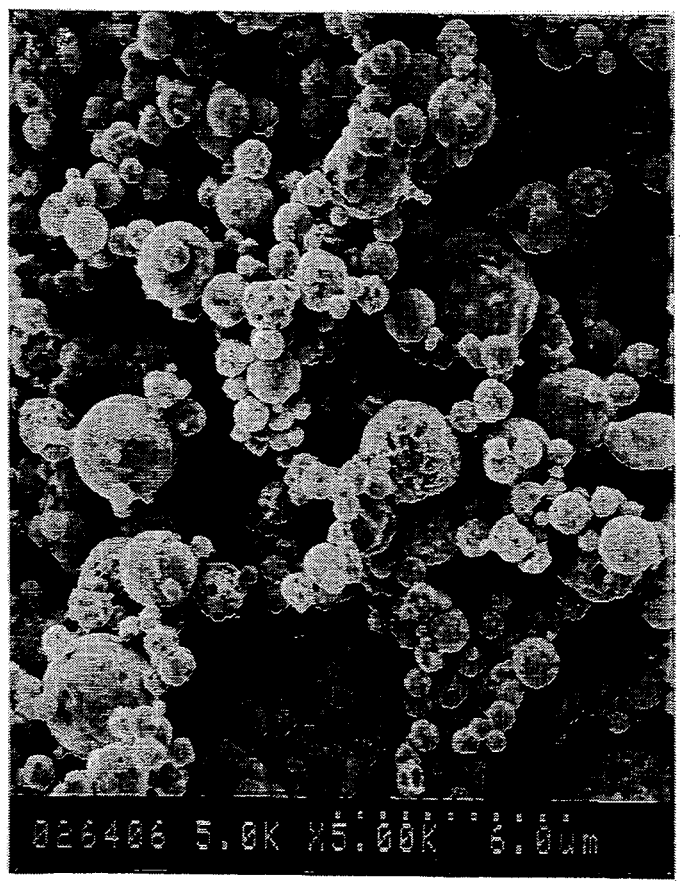
FIG. 3 is a scanning electron microscope microphotograph of the precursor particles showing the particle size range and the small grain size within a particle.

The powders produced by this process have a small particle size ranging from about 0.1 to 2 $\mu$m and a grain size less than 1000 angstroms, generally about 100 to 200 angstroms. Scanning electron microscopy shows the particles to have a small uniform grain size indicating chemical homogeneity as shown in the photomicrograph of FIG. 3.

EXAMPLE 2

In this example, superconducting tapes may be produced by the powder-in-tube method. The powder produced in Example 1 is placed into a 0.25 inch diameter silver wire and drawn to a round wire of about 0.05 inch in diameter. The wire is shaped into a tape by rolling to a thickness of about 0.01 inch and a width of about 0.05 inch. The tape is then sintered by heating to about 820° C. for 3 hours. The sintered tape is then deformed further and heated to 790°–830° C. for about 50 hours.

Superconductor tapes prepared by this process have critical temperatures of about 106K. Critical current densities of 10,000 A $cm^2$ at 77K can be obtained.

The small particle size and small grain of the powder as shown by scanning electron microscope, which indicates chemical homogeneity, promotes the rapid formation of the superconducting phase during the heat treatment. Heating times of about 3 hours at 800°–830° C. have produced superconductors substantially of the 2223 phase. The powder particle contains crystallites of metal oxides in the nanometer size range of about 20–100 nm. The small grain size provides a short diffusion distance among the cations to rapidly form the superconducting phase during sintering. The oxide superconducting core exhibited a high volume fraction of the desired superconducting phase and non-superconducting secondary phase particles less than about 5 $\mu$m.

It is to be understood that the forementioned description is illustrative only and that changes can be made in the apparatus, the components and their proportions, and in the sequence of combinations and process steps as well as in other aspects of the invention discussed herein without departing from the scope of the invention as defined in the following claims.

We claim:

1. A method for preparing lead stabilized precursor superconducting oxide powders comprising:
   a) atomizing an aqueous solution comprising metal cations of Bi, Pb, Sr, Ca and Cu in a carrier gas to form droplets, said carrier gas being selected from $O_2$, $N_2$, Ar, He and mixtures thereof, wherein said metal cations can be pyrolyzed to metal oxides, and wherein said aqueous solution contains said metal cations in a ratio capable of forming superconducting metal oxides;
   b) feeding said atomized solution and carrier gas through a heated reaction zone to heat said atomized solution to a temperature and for a time sufficient to pyrolyze said metal cations to form a precursor superconducting oxide powder substantially without vaporization and loss of lead from said powder, said precursor superconducting oxide powder comprising grains of crystalline or at least partially amorphous metal oxides having a size of less than about 1000 angstroms; and
   c) collecting said precursor superconducting oxide powder.

2. The process of claim 1, wherein said aqueous solution has a cation concentration of (Bi,Pb), Sr, Ca and Cu whereby said powder produces the 2223 superconducting phase by heating.

3. The method of claim 1, comprising heating said droplets in said reaction zone to a temperature of 600° C. to 1000° C.

4. The method of claim 3, comprising adjusting the flow rate of said carrier gas whereby said powder has a residence time of 0.1 to 60 seconds in said reaction zone.

5. The method of claim 1, comprising pyrolyzing said metal cations at a temperature of less than about 850° C.

6. The method of claim 1, comprising pyrolyzing said metal cations at a temperature of up to 750° C.

7. The method of claim 1, comprising maintaining a flow rate of said droplets and carrier gas through said reaction zone to have a residence time of up to about 5 seconds in said reaction zone.

8. The method of claim 1, comprising atomizing said solution to form droplets substantially having a droplet size of less than 10 μm.

9. The method of claim 1, comprising pyrolyzing said metal cations to form said powder having a particle size range of 0.1 μm to 2.0 μm, each particle comprising grains of crystalline or at least partially amorphous metal oxides of less than about 1000 Å.

10. The process of claim 9, comprising producing powder particles comprising grains of crystalline or at least partially amorphous metal oxides of less than about 200 angstroms.

11. A process for forming superconductor articles comprising:
   a) forming a precursor superconducting oxide powder by atomizing a metal cation solution comprising metal cations of Bi, Pb, Sr, Ca and Cu to form droplets in a carrier gas and pyrolyzing said metal cations at a temperature and for a time sufficient to convert said metal cations to oxides substantially without vaporization and loss of lead to form said precursor superconducting oxide powder having a particle size of about 0.1 μm to 2.0 μm and a grain size of less than 1000 angstroms, said metal cation solution containing metal cations in a ratio capable of forming superconducting metal oxides,
   introducing said precursor into a metal body and deforming said body to reduce the diameter and form a deformed body,
   sintering said deformed body at an effective temperature for a sufficient time to form a superconductor article having superconducting phases.

12. The process of claim 11, wherein said article is a tape and said process is a continuous process comprising pressing said wire to a thickness of about 0.01 to 0.02 inch thick.

13. The process of claim 11, wherein said metal cation solution is a metal nitrate solution and said pyrolyzing step is at a temperature of up to 850° C.

14. The process of claim 11, wherein said metal cation solution is a metal nitrate solution comprising nitrates of Bi, Pb, Sr, Ca and Cu.

15. The process of claim 11, wherein said nitrate solution has a cation concentration of (Bi,Pb), Sr, Ca and Cu whereby said sintering step forms a 2223 superconducting phase.

16. The process of claim 11, wherein said superconducting articles are multifilament articles.

17. The process of claim 16, wherein said multifilament articles comprise filaments having a diameter of about 1 to 5 microns.

18. The process of claim 11, further comprising deforming said sintered body and heating said body to form a superconducting article.

19. The process of claim 11, comprising drawing said body to form a wire having a diameter of about 0.05 to 0.75 inch.

20. The process of claim 11, wherein said step of forming said precursor comprises pyrolyzing said metal cation at a temperature of up to 850° C. for up to about 5 seconds to form powder oxide particles having a grain size of less than about 200 Å.

21. The process of claim 11, wherein said powder has a grain size of about 100–200 angstroms and said superconducting articles contain non-superconducting secondary phase particles of less than about 5 μm.

22. The process of claim 11, wherein said step of sintering said body comprises heating said body at a temperature of about 800°–840° C. for about 3–10 hours.

23. The process of claim 11, wherein said metal body is a metal tube.

24. The process of claim 11, wherein said metal body is a metal billet having a plurality of holes therein and said superconductor article is a multifilamentary conductor.

25. The process of claim 23, wherein said metal tube comprises metal selected from the group consisting of silver, silver alloys, gold, and gold alloys.

26. The process of claim 24, wherein said metal billet comprises metal selected from the group consisting of silver, gold and alloys thereof.

* * * * *